(12) United States Patent
Kim et al.

(10) Patent No.: US 6,583,465 B1
(45) Date of Patent: Jun. 24, 2003

(54) CODE ADDRESSABLE MEMORY CELL IN A FLASH MEMORY DEVICE

(75) Inventors: Min Kyu Kim, Seoul (KR); Byung Jin Ahn, Seoul (KR); Ju Yeab Lee, Kyungki-Do (KR); Sheung Hee Park, Seoul (KR)

(73) Assignee: Hyundai Electronics Industries Co., Ltd, Kyungki-Do (KR)

( * ) Notice: Subject to any disclaimer, the term of this patent is extended or adjusted under 35 U.S.C. 154(b) by 28 days.

(21) Appl. No.: 09/722,352

(22) Filed: Nov. 28, 2000

(30) Foreign Application Priority Data

Dec. 28, 1999 (KR) .............................................. 99-63902

(51) Int. Cl.⁷ ............................................... H01L 29/76
(52) U.S. Cl. ...................................... 257/314; 257/315
(58) Field of Search ................................. 438/211, 257; 257/314, 315

(56) References Cited

U.S. PATENT DOCUMENTS

| | | | | |
|---|---|---|---|---|
| 4,812,885 A | * | 3/1989 | Riemenschneider | |
| 5,102,814 A | * | 4/1992 | Woo | |
| 5,466,624 A | * | 11/1995 | Ong et al. | |
| 5,553,018 A | * | 9/1996 | Wang et al. | |
| 5,589,699 A | * | 12/1996 | Araki | |
| 5,789,776 A | * | 8/1998 | Lancaster et al. | |
| 5,859,452 A | * | 1/1999 | Jo et al. | |
| 5,898,614 A | * | 4/1999 | Takeuchi | |
| 6,093,603 A | * | 7/2000 | Yamaguchi | |
| 6,153,469 A | * | 11/2000 | Yun et al. | |
| 6,236,081 B1 | * | 5/2001 | Fukumoto | |
| 6,268,622 B1 | * | 7/2001 | Shone et al. | |

FOREIGN PATENT DOCUMENTS

JP         10150173     * 6/1998

* cited by examiner

Primary Examiner—Eddie Lee
Assistant Examiner—Eugene Lee
(74) Attorney, Agent, or Firm—Finnegan, Henderson, Farabow, Garrett & Dunner L.L.P.

(57) ABSTRACT

There is disclosed a code addressable memory ("CAM") cell in a flash memory device. In order to stabilize the operation of the CAM cell in a flash memory device operating at a low voltage, the present invention manufactures a CAM cell in which a floating gate is formed to extend on more than two active regions and more than two cell arrays are connected in parallel commonly using a source region and a drain region. Therefore, the present invention can increase the gate-coupling ration of the CAM cell, thus stabilizing the operation of the CAM cell at a device for low-voltage use.

2 Claims, 3 Drawing Sheets

CODE ADDRESSABLE MEMORY CELL IN A FLASH MEMORY DEVICE

CROSS-REFERENCE TO RELATED APPLICATION

Priority is claimed from Republic of Korean Patent Application No. 99-63902 filed Dec. 28, 1999, which is incorporated in its entirety by reference.

BACKGROUND OF THE INVENTION

1. Field of the Invention

The invention relates generally to a code addressable memory (hereinafter called "CAM") cell in a flash memory device, and more particularly to, a CAM cell in a flash memory device capable of improving the operation characteristic of the CAM cell at a low voltage.

2. Description of the Prior Art

A flash memory device is an electrically erasable and programmable non-volatile memory device, which has protection/non-protection function on code information that should be protected when the flash memory product is used and a function allowing a repair, etc. for improving the throughput during product test process. For example, the flash memory device has a function to store the name of the manufacture and its serial number on the product using flash memory device and to store information protecting a specific memory region in a code information of information that should be protected in order to prevent information being deleted by users.

For this, CAM circuits using CAM cells like a flash memory cell is inserted into peripheral circuits. The CAM cell is usually used for the purpose of repair or protect, and CAM data must be easily read-out even at power supply voltage Vcc upon a normal read operation. Then, the conventional CAM cell will be below explained by reference to FIG. 1.

FIGS. 1A and 1B are diagrams for explaining a structure of a code addressable memory cell in a flash memory device, where FIG. 1A shows its layout and FIG. 1B is its schematic view.

As shown, a gate in which a floating gate 12 and a control gate 13 are stacked is formed on a semiconductor substrate 11 and a source S and a drain D are formed on both sides of the semiconductor substrate 11. As such, the conventional CAM cell has a structure like a main cell.

Generally, information stored at the cell is read-out by applying a voltage to the control gate and then sensing the amount of current flowing into the drain D. At this time, in most case, the voltage applied to the control gate usually directly uses the power supply voltage Vcc. However, as most of the current flash memory devices are driven at a low voltage, there is a problem that if the power supply voltage Vcc is directly used, the amount of current flowing into the drain is too small, thus making its sensing difficult.

In other words, upon a read-out of the CAM cell, the conductance Gm of the cell is lowered due to a coupling capacitance of about 0.55 that is generated in the dielectric film between the floating gate 12 and the control gate 13. Due to this, with the threshold voltage $V_T$ of about 2.0V like the main cell, the operation voltage of the memory device used as the voltage to the control gate 13 is lowered, thus rapidly reducing the amount of current in the cell. Therefore, as it is difficult to read out certain cell information, a method of sensing data stored in the CAM cell is used by which the cell is inevitably over-erased to lower the threshold voltage of the cell 0V less. However, if the CAM cell is over-erased, there is a problem that it is difficult to store information for a long time due to leak current, etc. from the cell in undesired circumstances in which the cell must be operated at a high temperature and at a high voltage.

SUMMARY OF THE INVENTION

It is therefore an object of the present invention to provide a CAM cell in a flash memory device that can be safely operated at a low voltage, by increasing the coupling ratio of a floating gate and a control gate.

In order to accomplish the above object, a CAM cell in a flash memory device according to the present invention is characterized in that it comprises field oxide films formed on a semiconductor substrate in order to define active regions; a floating gate electrically isolated from the semiconductor substrate by a tunnel oxide film, formed to share the active regions of at least more than two isolated by the field oxide film; a dielectric film formed on the floating gate; a control gate formed to overlap with the floating gate, on the dielectric film; a plurality of sources and a plurality of drains isolated by the control gate, each formed in the plurality of active regions; and a source line connecting the plurality of sources and a drain line connecting the plurality of drains.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Erase operation of a flash memory cell is to remove charges charged within a floating gate in order to increase its potential, by applying a negative bias to a control gate and applying a high positive bias to a substrate. The most important thing in this erase operation is a gate-coupling ratio $K_{ipo}$ being a factor by which the voltage of the control gate is transferred to the floating gate. That is, as the gate-coupling ratio $K_{ipo}$ increases, the threshold voltage of the cell can be effectively lowered after erase operation of the cell.

Below, preferred embodiments of the present invention will be described in detail with reference to accompanying drawings.

Figure 1A:
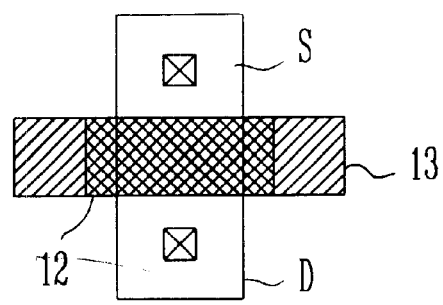
FIGS. 1A and 1B are a schematic view of a structure of a code addressable memory cell in a flash memory device and a cross-sectional view thereof.
Figure 1B:
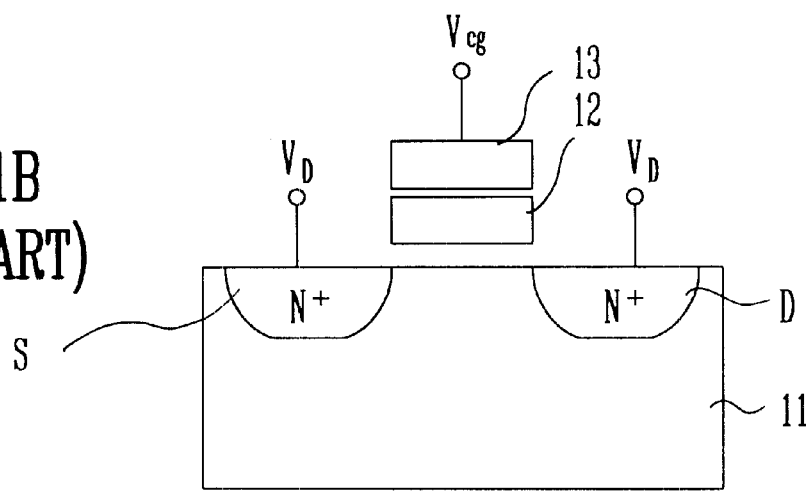
Figure 2:
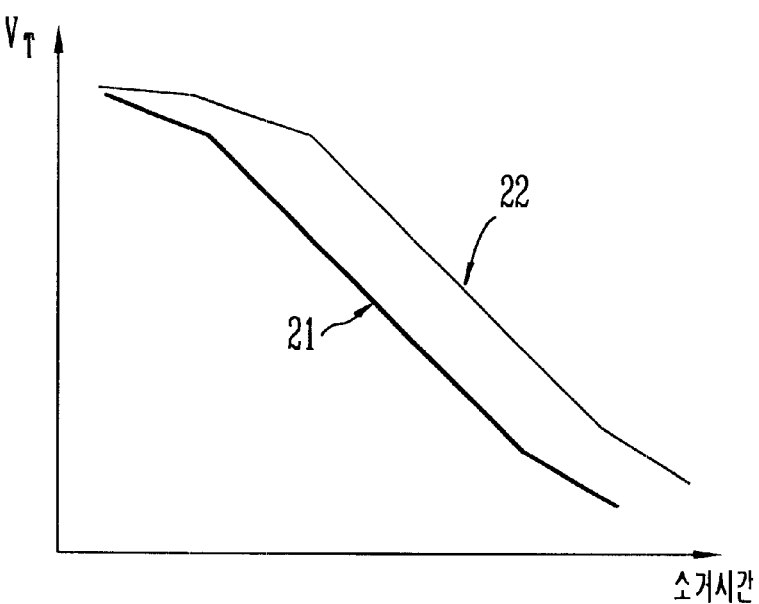
FIG. 2 is a graph for explaining the characteristic of variation in the threshold voltage in a code addressable memory cell, depending on an erase time of the code addressable memory cell and its gate-coupling ratio.

FIG. 2 is a graph for explaining the characteristic of variation in the threshold voltage in a code addressable memory cell, depending on an erase time of the code addressable memory cell and its gate-coupling ratio.

As shown in FIG. 2, in case that the coupling ratio $K_{ipo}$ of the control gate and the floating gate is large 21, a bias can be easily transferred to the floating gate at a low gate bias, compared to the case that the gate-coupling ratio $K_{ipo}$ is low 22. Therefore, erase can be performed at high degree and the threshold voltage of the CAM cell can be thus effectively lowered if they are erased during the same time period.

Figure 3:
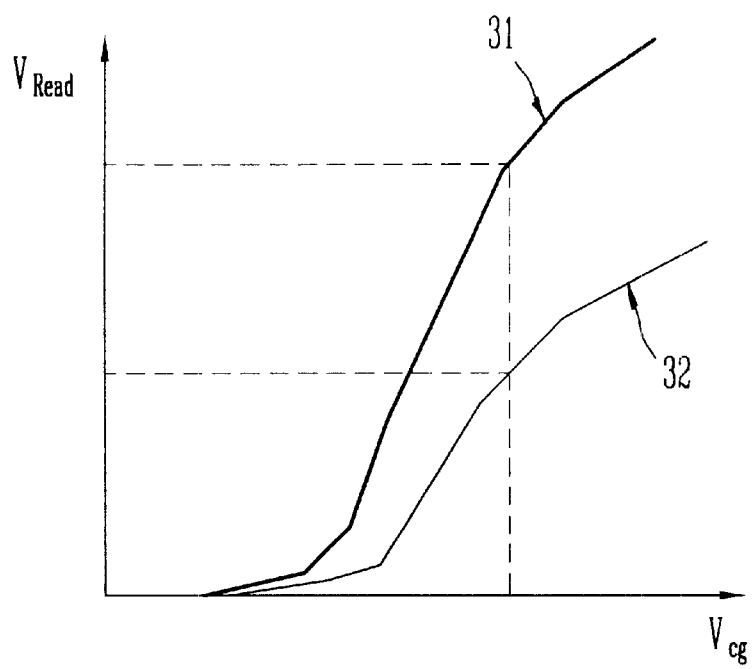
FIG. 3 is a graph for explaining the characteristic of variation in a read-out current depending on a control gate voltage of a code addressable memory cell and a gate-coupling ratio.

FIG. 3 is a graph for explaining the characteristic of variation in a read-out current, depending on the control gate voltage of the code addressable memory cell and the gate-coupling ratio.

As shown in FIG. 3, it can be seen that the amount of the read-out current $I_{Read}$ in case that the gate-coupling ratio $K_{ipo}$ is large 31 is larger than that in the case that the gate-coupling ratio $K_{ipo}$ is low 32.

For example, if the control gate voltage Vcg is Vcc, the read-out current $I_{Read}$ of the CAM cell having a large gate-coupling ratio $K_{ipo}$ is twice than that having a small gate-coupling ratio $K_{ipo}$.

In this result, it can be seen that if the gate-coupling ratio $K_{ipo}$ is made large, the threshold voltage of the CAM cell can be further effectively reduced and the amount of the drain current can also be increased, when erase operation for the same CAM cell is performed for the same time period. The present invention relates to method of increasing the gate-coupling ratio $K_{ipo}$, which employs a method of increasing the contact area of the floating gate and the control gate. That is, in the present invention, more than two cell array connected in parallel share a drain and a source.

Figure 4A:
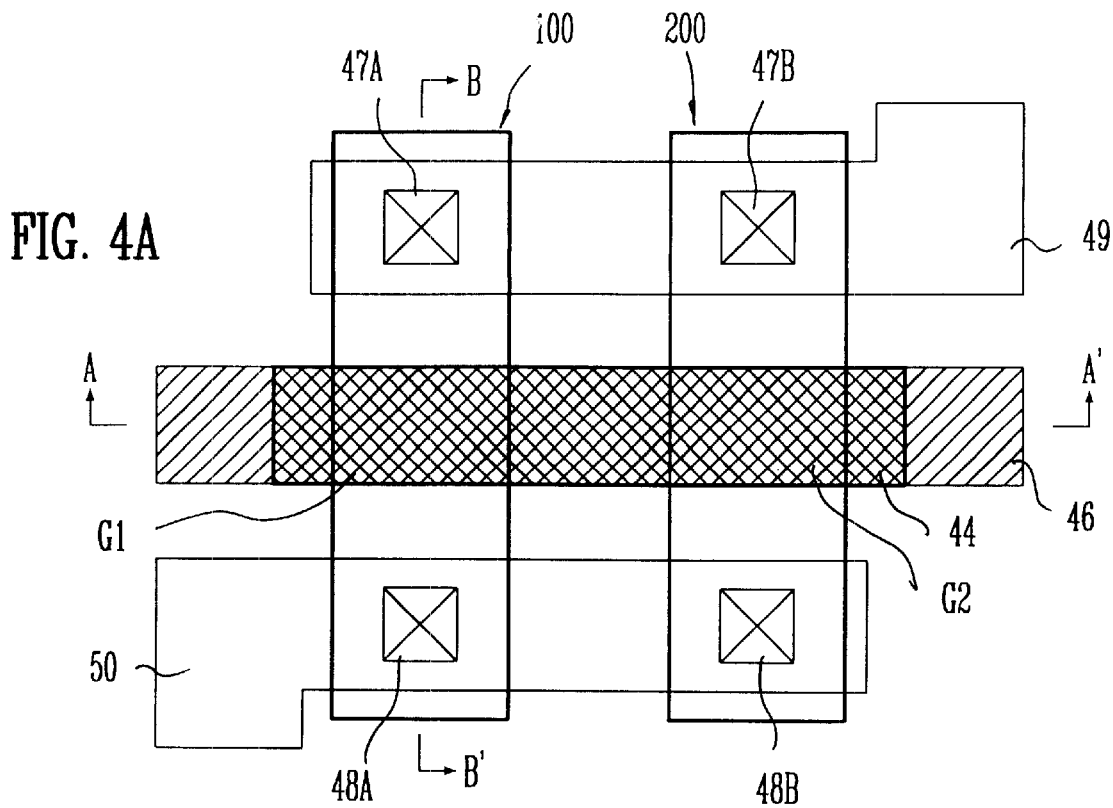
FIGS. 4A to 4C show a layout and a cross-sectional view for explaining a code addressable memory cell in a flash memory device according to a first embodiment of the present invention.
Figure 4B:
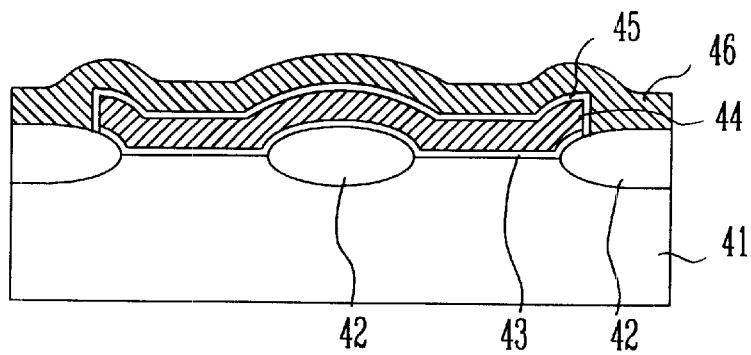
Figure 4C:
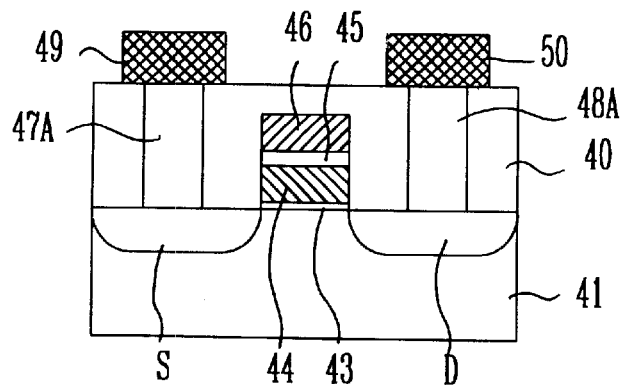

FIGS. 4A to 4C show a layout and a cross-sectional view for explaining a code addressable memory cell in a flash memory device according to a first embodiment of the present invention, wherein FIG. 4B shows a cross-sectional view taken along lines A–A' in FIG. 4A and FIG. 4C shows a cross-sectional view taken along lines B–B' in FIG. 4A.

As shown, after field oxide films 42 are formed on a semiconductor substrate 41, a floating gate 44 electrically isolated from the semiconductor substrate 41 by a tunnel oxide film 43, is on the semiconductor substrate 41 in which an active region and a field region are defined. At this time, the floating gate is formed to extend on the field oxide films 42 between two neighboring active regions and neighboring active regions 100 and 200 so that it shares the neighboring two active regions 100 and 200. Next, a dielectric film 45 and a control gate 46 are formed on the floating gate 44 in a self-alignment manner to the floating gate 44. Thus, first and second gates G1 and G2 are formed in the first and second active regions 100 and 200, respectively. Then, after a source region S and a drain region D are formed in the first and second active regions 100 and 200, respectively, by source/drain ion implantation process, an interlayer insulating film 40 is formed on the entire structure. Thereafter, the interlayer insulating film 40 is etched to expose the source region S and the drain region D, thus forming a contact hole. Next, by burying the contact hole with conductive materials such as metal, etc., first source and drain contacts 47A and 48A are formed in the first active region 100 while second source and drain contacts 47B and 48B are formed in the second active region 200. Then, a source line 49 is formed by connecting the first and second source contacts 47A and 47B, and a drain line 50 is formed by connecting the first and second drain contacts 48A and 48B. As a result, in the CAM cell, the floating gate 44, the dielectric film 45 and the control gate 46 are formed on the field oxide films 42 between the two neighboring active regions 100 and 200. Also, the source line 49 and the drain line 50 share the source and the drain, respectively. Thus, as the floating gate 44 is formed to extend on the field oxide film 42, the contact area with the control gate 46 is increased, so that the gate-coupling ratio of the cell is increased.

Figure 5:
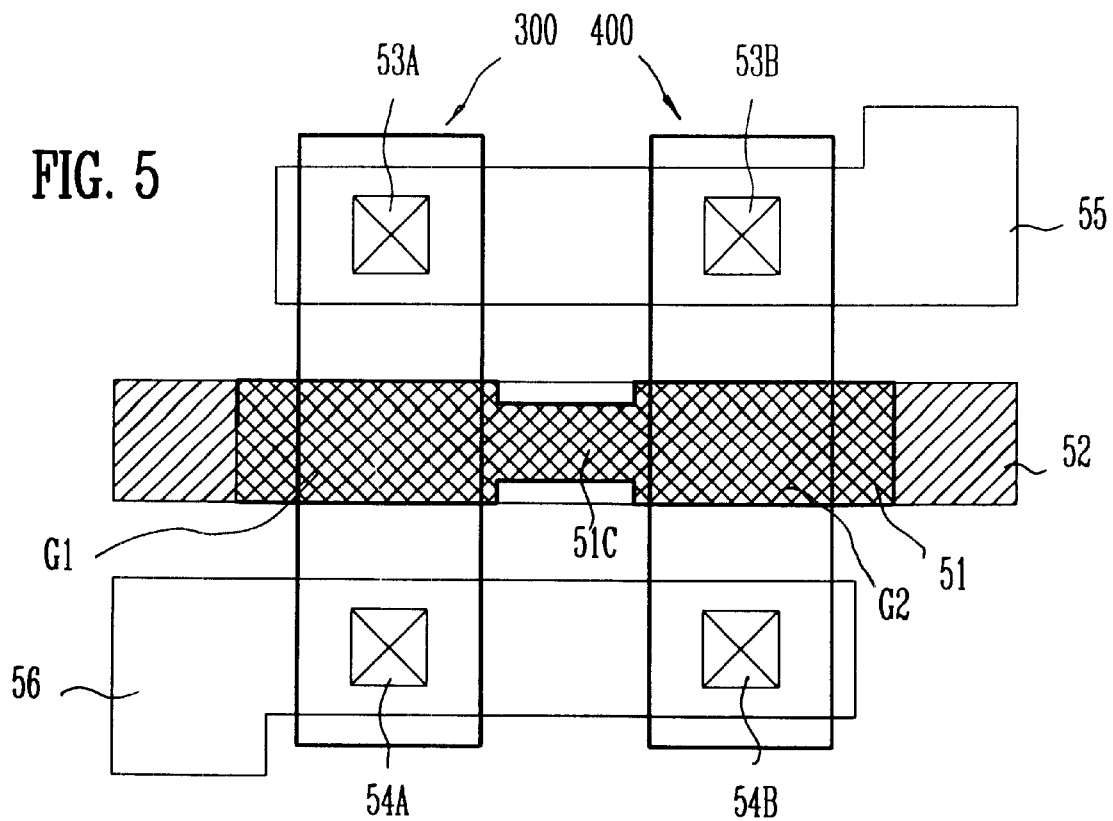
FIG. 5 is shows a layout for explaining a code addressable memory cell in a flash memory device according to a second embodiment of the present invention.

FIG. 5 is shows a layout for explaining a code addressable memory cell in a flash memory device according to a second embodiment of the present invention.

In the second embodiment of the present invention, a floating gate 51 is formed to extend from the active region to the field oxide films between the neighboring active regions 300 and 400, wherein the control gate 52 is formed to surround the floating gate 51 in the portion 51C in which the floating gate on the field oxide films is extended, in order to further increase the coupling ratio of the floating gate 51 and the control gate 52. That is, it increases the contact area of the floating gate 51 and the control gate 52, by reducing the width of the floating gate 51 located on the filed oxide films. Thereafter, by performing a source/drain formation process, an interlayer insulating formation process and a contact hole formation process, first and second source contacts 53A and 53B and first and second drain contacts 54A and 54B are formed. A source line 55 is formed by connecting a first source contact 53A to a second contact 53B using a metal line. And a drain line 56 is formed by connecting a first drain contact 54A to a second drain contact 54B using a metal line.

In the CAM cell having this structure, as more than two CAM cells are connected in parallel, current flows twice even at the same erase state. Therefore, there is an advantage that sensing can be easily performed since a high current can be obtained in the same erase threshold voltage. Also, as the floating gate, the dielectric film and the control gate are located on the field oxide films, the gate-coupling ratio $K_{ipo}$ can be significantly improved compared to the conventional CAM cell. Thus improved gate-coupling ratio $K_{ipo}$ can not only increase the drain current but also improve the erase speed. Therefore, the CAM cell according to the present invention can be applied a flash memory device for low-voltage use.

As mentioned above, the present invention can increase the gate-coupling ration since the contact area of a floating gate and a control gate is increased. Also. the present invention has outstanding effects that the erase speed of a CAM cell is improved since the drain current in the CAM cell is increased and the CAM cell can be thus safely driven even in the flash memory device for low-voltage use.

The present invention has been described with reference to particular embodiments in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A code addressable memory cell in a flash memory device, comprising:

field oxide films formed on a semiconductor substrate in order to define active regions;

a floating gate electrically isolated from said semiconductor substrate by a tunnel oxide film, said floating gate overlapping said field oxide film and at least two of said active regions isolated by said field oxide film;

a dielectric film formed on said floating gate;

a control gate formed on said dielectric film, said control gate overlapping said floating gate;

a plurality of sources and a plurality of drains isolated by said control gate, each formed in said plurality of active regions; and a source line connecting said plurality of sources and a drain line connecting said plurality of drains.

2. The code addressable memory cell in a flash memory device according to claim 1, wherein width of said floating gate on said field oxide film is narrower than the width of said floating gate on said active regions.

* * * * *